United States Patent [19]
Dando et al.

[11] Patent Number: 5,978,230
[45] Date of Patent: Nov. 2, 1999

[54] BATTERY MOUNTING APPARATUSES, ELECTRONIC DEVICES, AND METHODS OF FORMING ELECTRICAL CONNECTIONS

[75] Inventors: Ross S. Dando, Nampa; Rickie C. Lake, Eagle; Krishna Kumar, Boise, all of Id.

[73] Assignee: Micron Communications, Inc., Boise, Id.

[21] Appl. No.: 09/026,250

[22] Filed: Feb. 19, 1998

[51] Int. Cl.⁶ .................................................... H05K 7/06
[52] U.S. Cl. ...................... 361/777; 361/749; 361/760; 361/782; 174/260; 174/261; 343/702; 264/272.11; 264/272.21; 29/855
[58] Field of Search .................................. 361/683, 736, 361/737, 748–752, 757, 758, 760, 767, 768, 770, 771, 777, 779, 782, 783, 807, 808, 811, 814, 820, 821; 174/250, 253–256, 258–261; 29/832, 841, 854, 855; 235/380, 491, 492; 343/702; 257/679, 924; 429/96, 98, 100, 161, 162, 163; 439/500, 504, 627; 264/272.21

[56] References Cited

U.S. PATENT DOCUMENTS

| | | | |
|---|---|---|---|
| 3,339,169 | 8/1967 | Freeland | 439/627 |
| 4,635,354 | 1/1987 | Chrobak et al. | 361/779 |
| 4,872,844 | 10/1989 | Grebe et al. | 361/736 |
| 5,805,423 | 9/1998 | Wever et al. | 361/760 |

OTHER PUBLICATIONS

U.S. application No. 09/026,247, Scott T. Trosper, filed Feb. 19, 1998.
U.S. application No. 09 026,249, Ford B. Grigg et al., filed Feb. 19, 1998.

Primary Examiner—Leo P. Picard
Assistant Examiner—John B. Vigushin
Attorney, Agent, or Firm—Wells, St. John, Roberts Gregory & Matkin P.S.

[57] ABSTRACT

Battery mounting apparatuses, electronic devices, and methods of forming electrical connections are described. In one implementation, a flexible circuit substrate has an area within which an electrical component, e.g. a thin-profile battery terminal housing member, is to be adhered. A conductive contact node pattern is disposed within the area and sized to be conductively adhered with the component. In one aspect, the conductive contact node pattern comprises an outer conductive node on the substrate at least a portion of which is positioned within the outermost 25% of the area. An electrical component is conductively bonded with the contact node pattern and encapsulating material is provided over and underneath the component. In a preferred aspect, the substrate and electrical component are vacuum processed sufficiently to redistribute the encapsulating material under the component. The positioning of the contact node pattern provides sufficient support during vacuum processing such that any tendency of the substrate to become lodged against the component is reduced, if not eliminated.

41 Claims, 10 Drawing Sheets

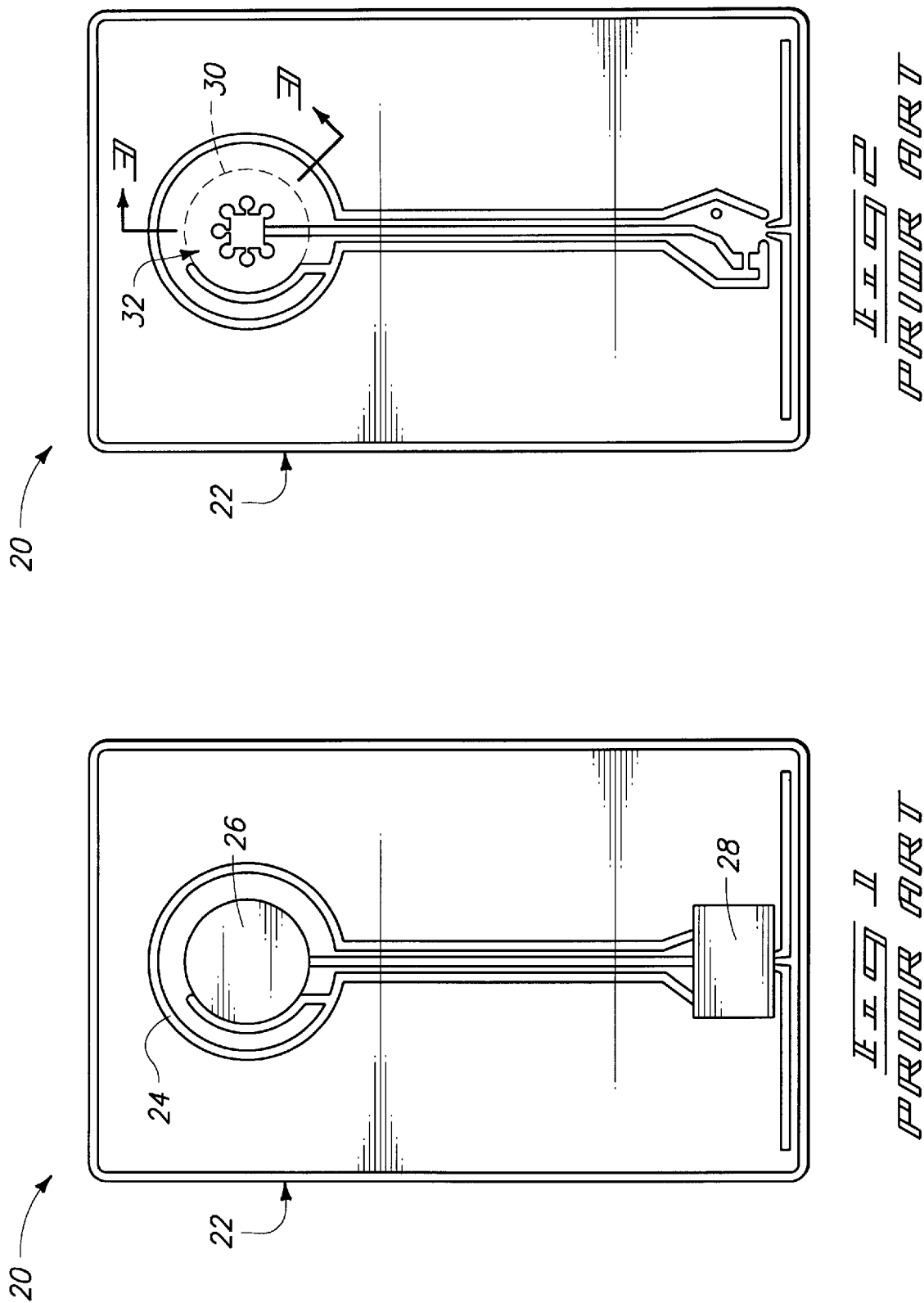

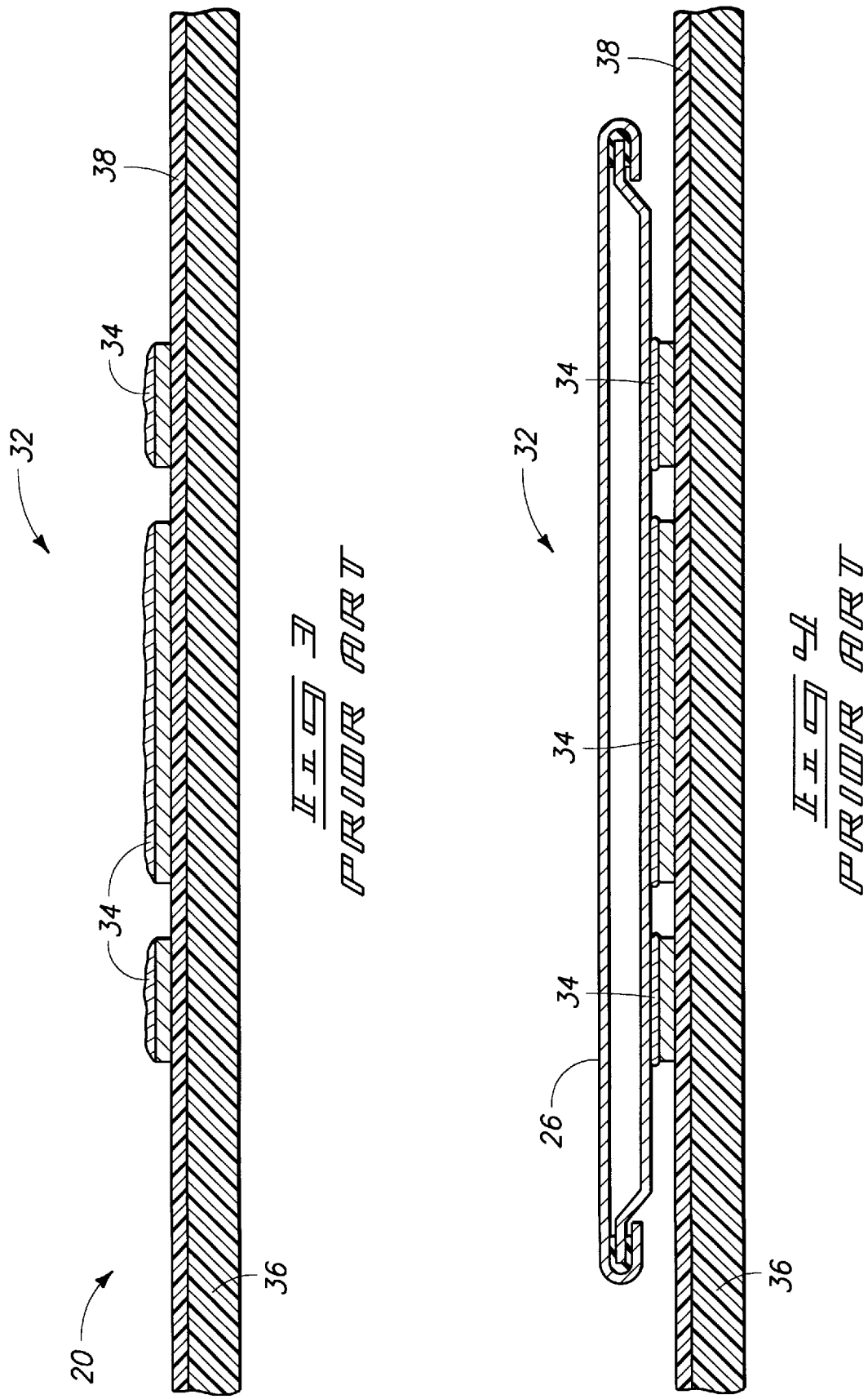

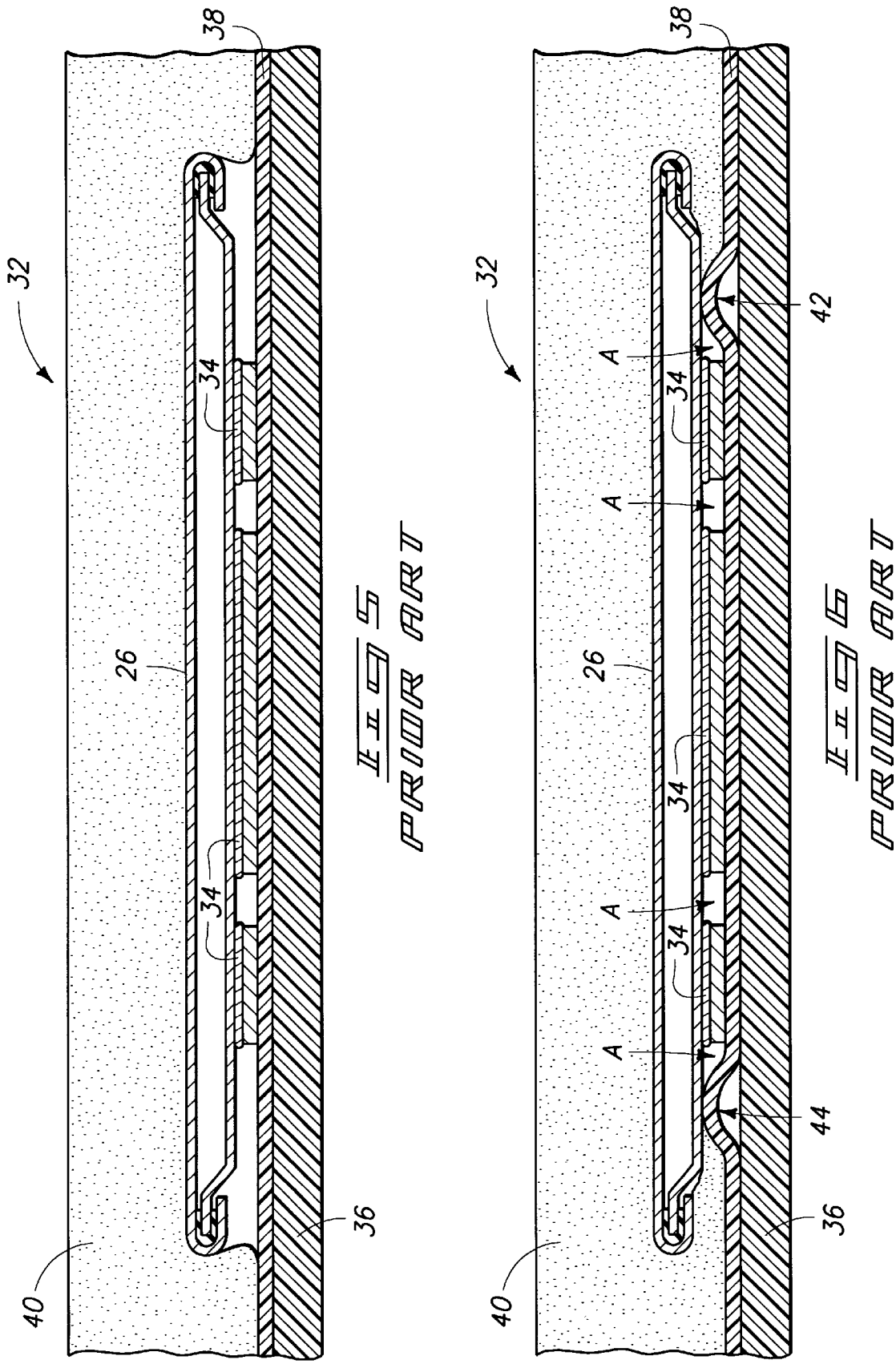

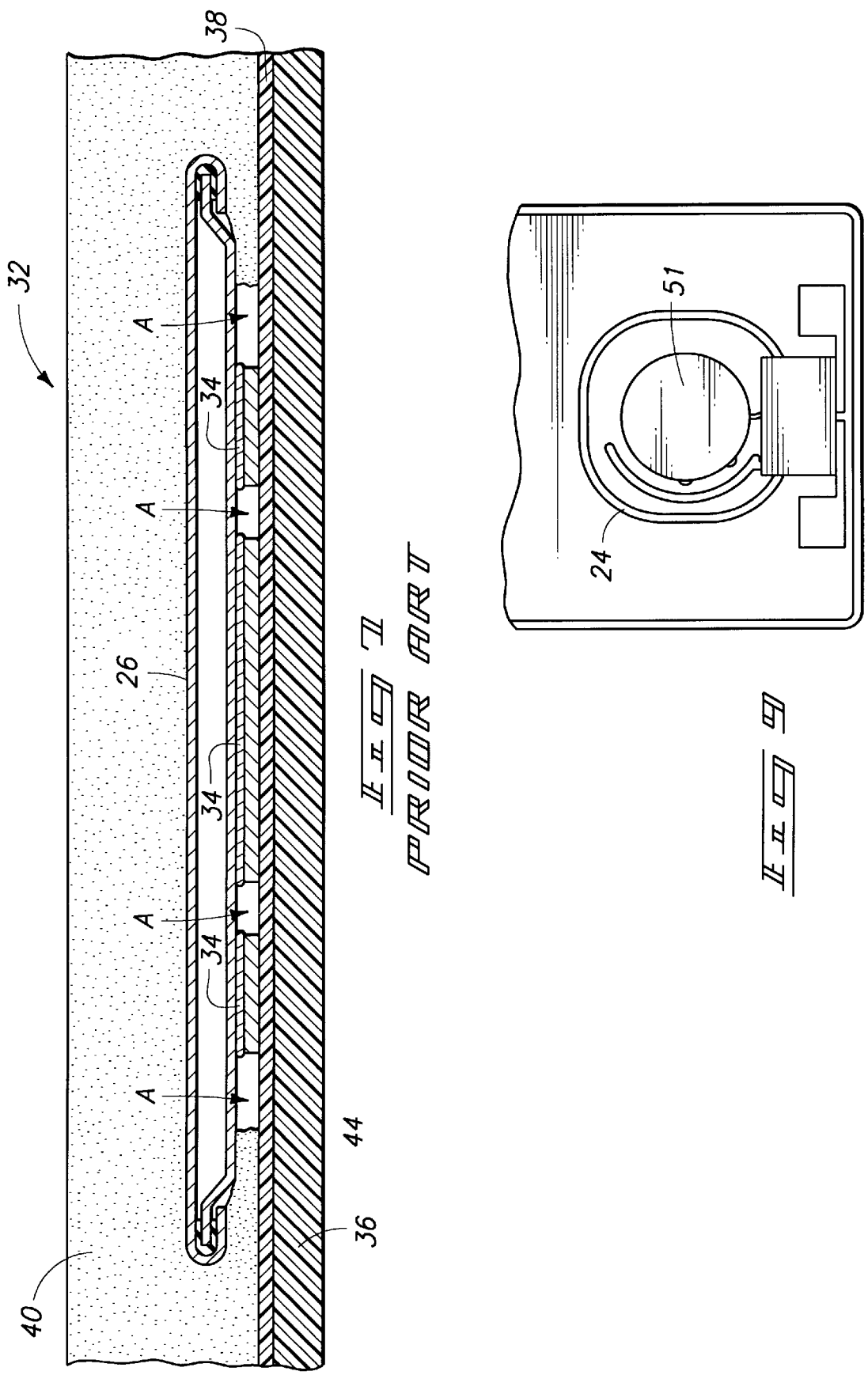

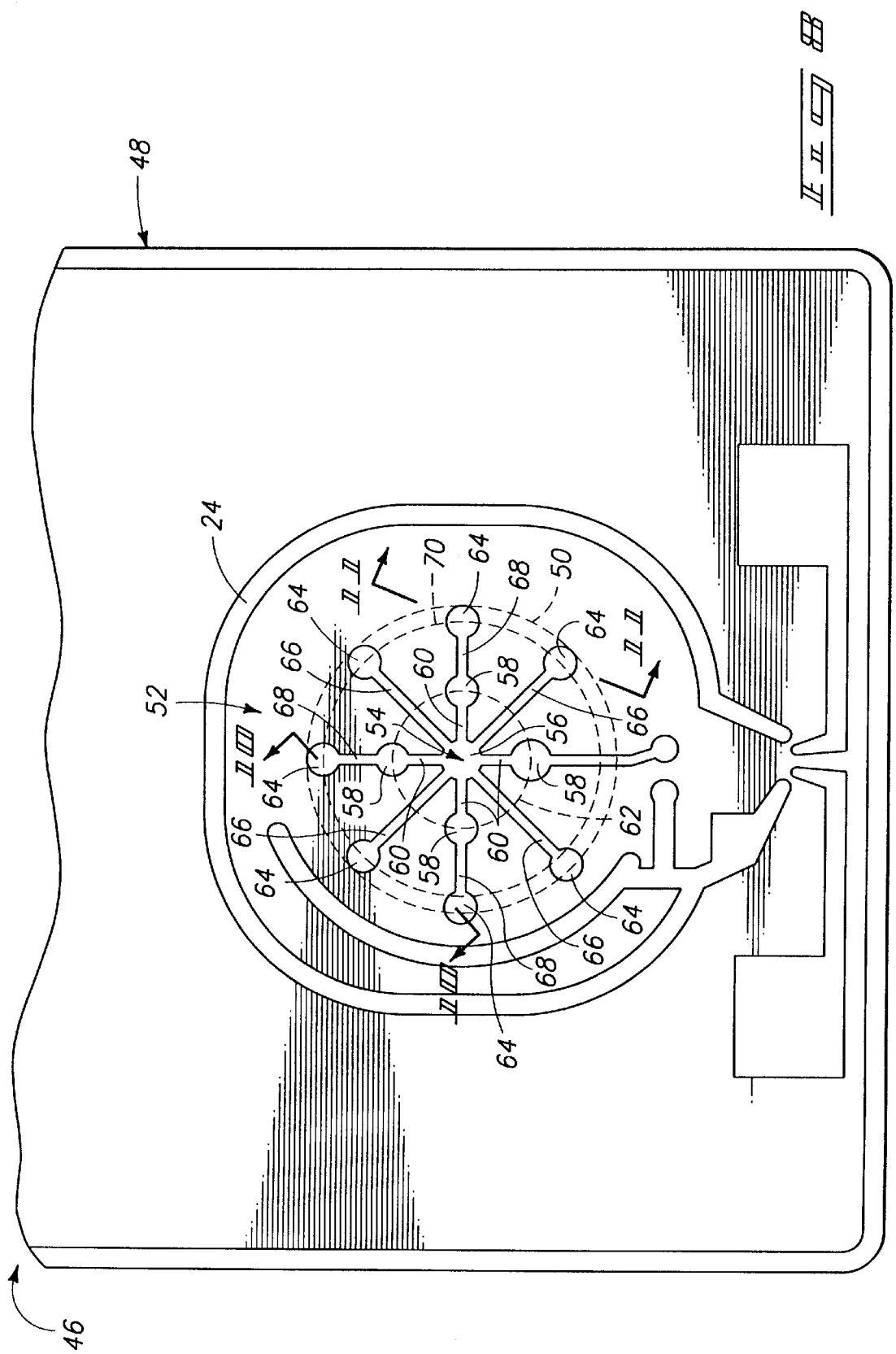

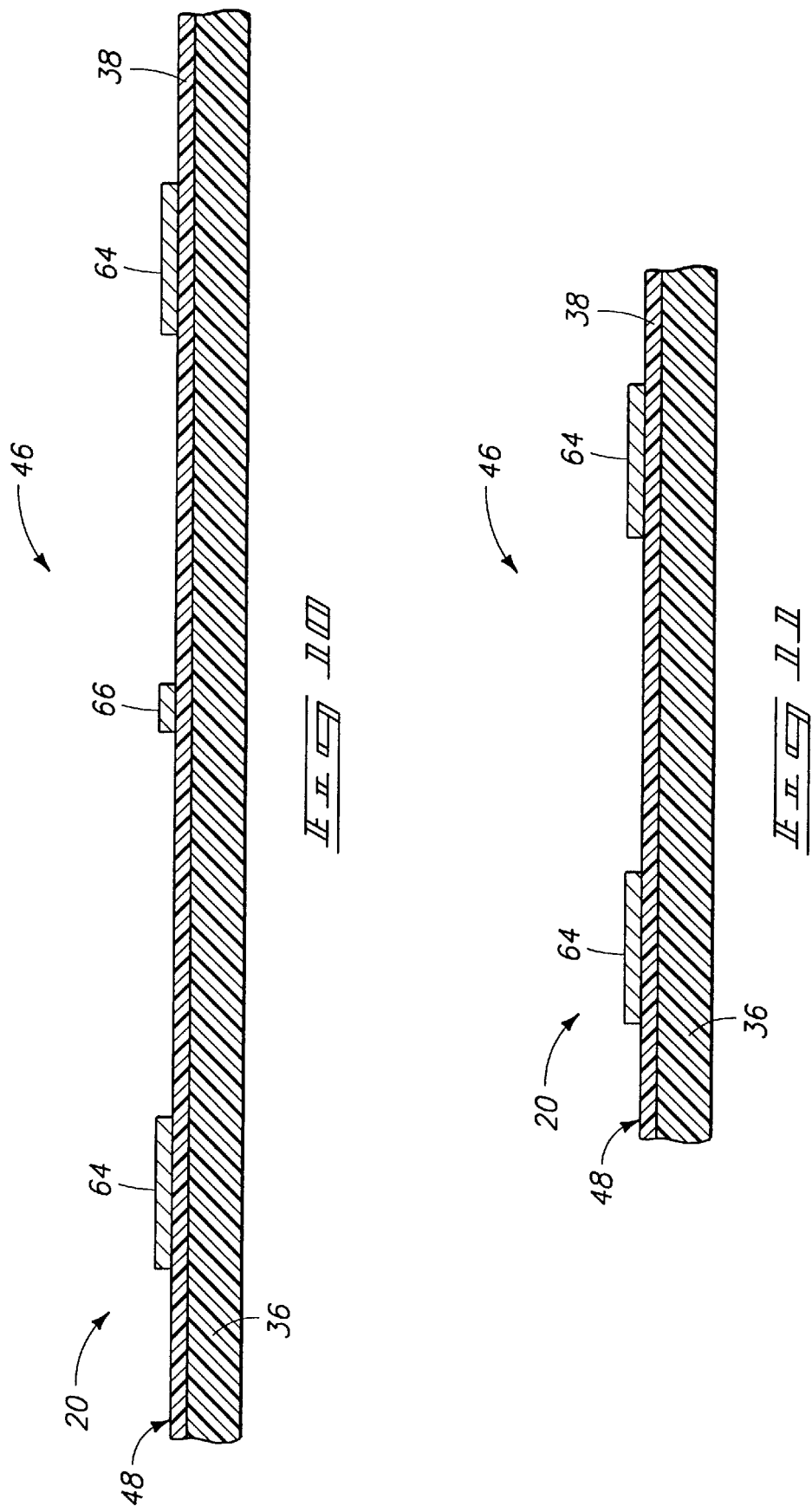

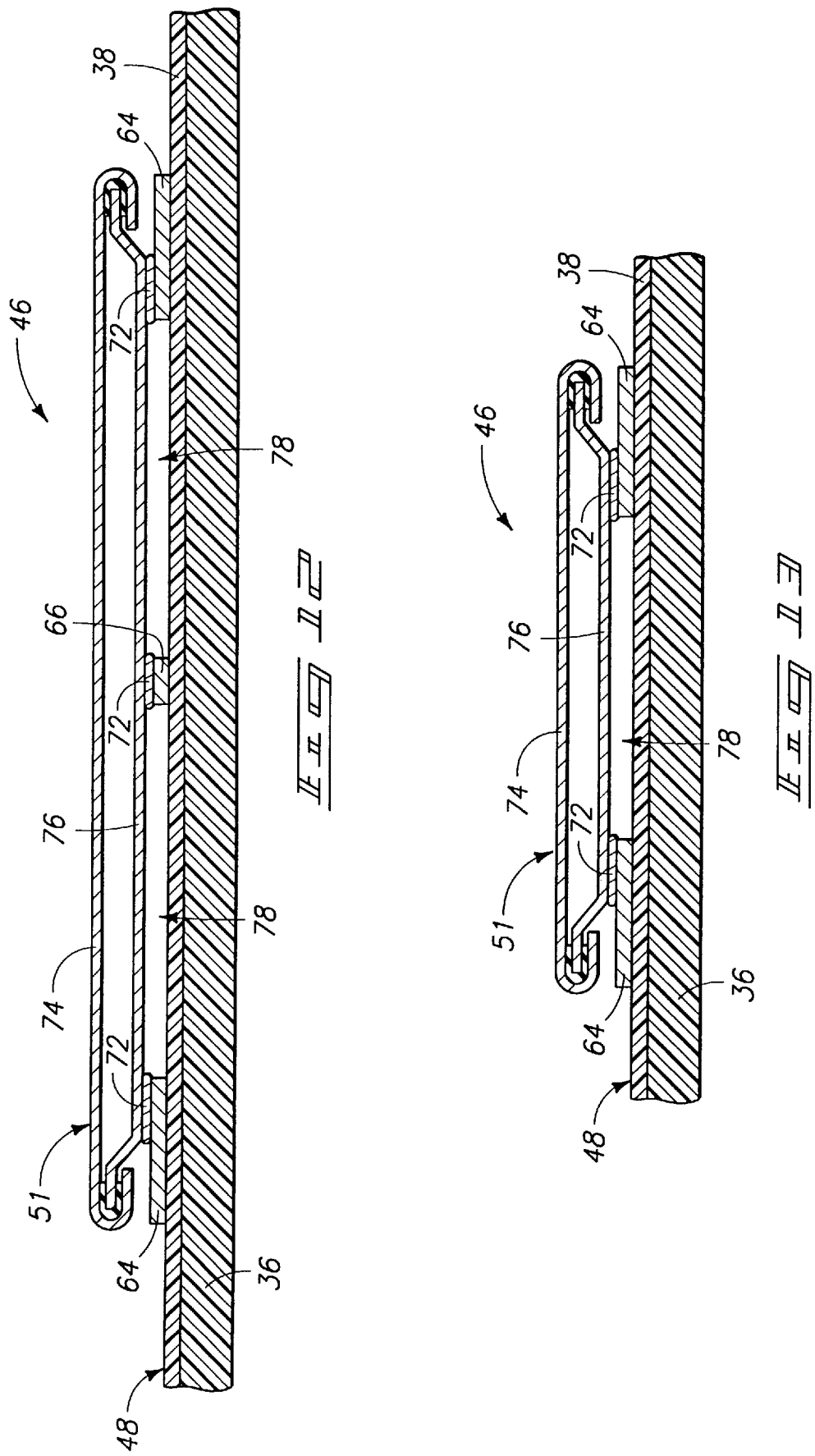

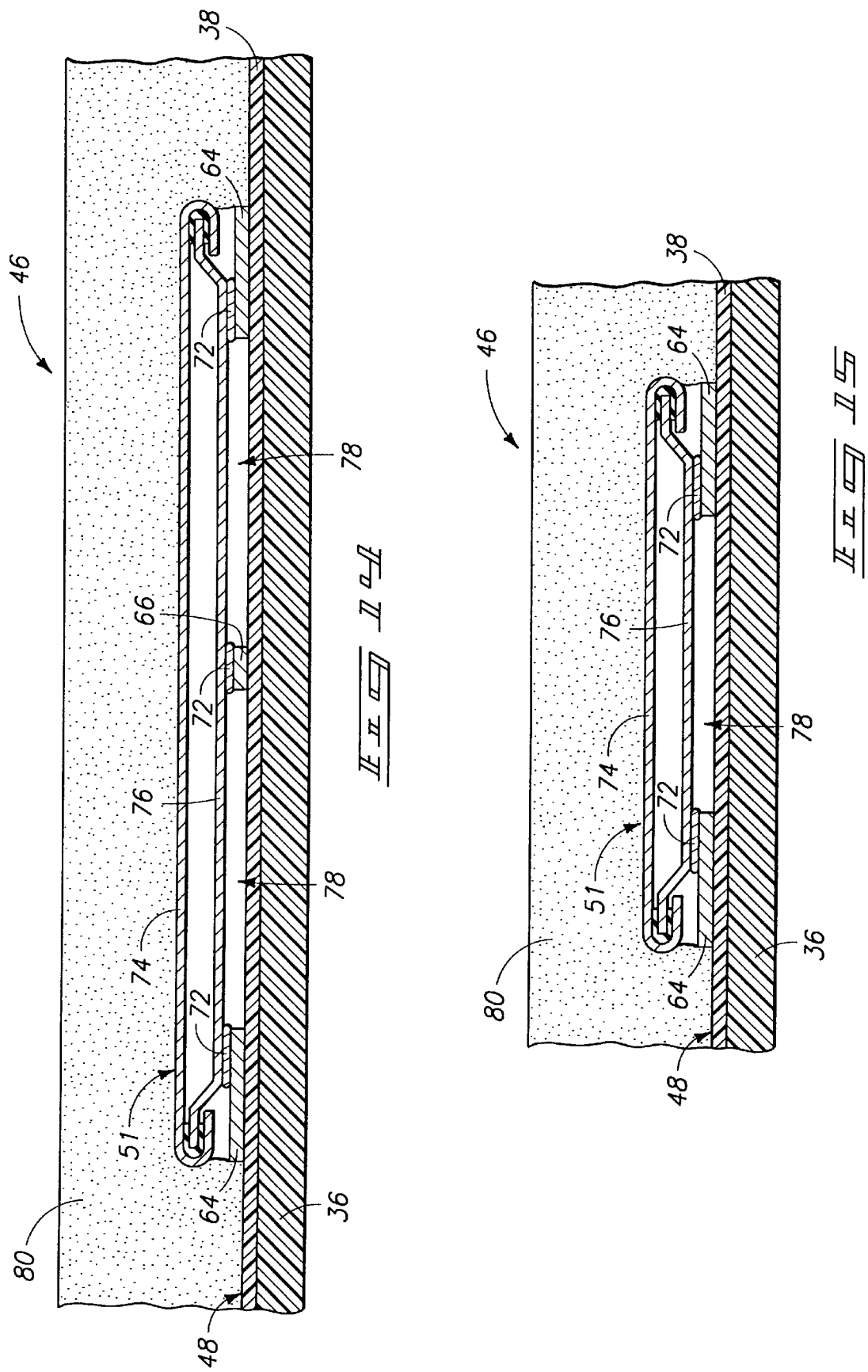

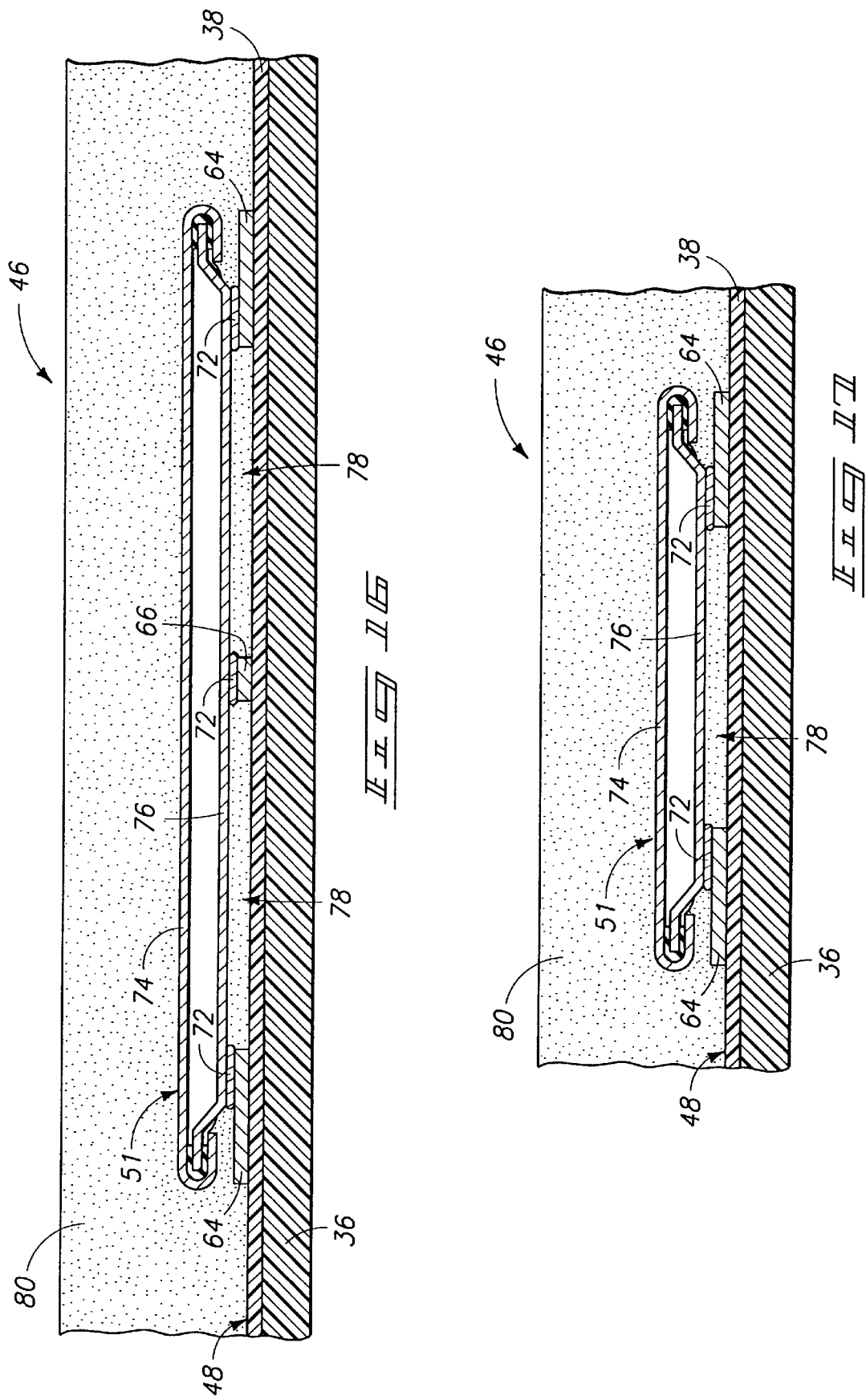

BATTERY MOUNTING APPARATUSES, ELECTRONIC DEVICES, AND METHODS OF FORMING ELECTRICAL CONNECTIONS

TECHNICAL FIELD

This invention relates to battery mounting apparatuses, electronic devices, and methods of forming electrical connections.

BACKGROUND OF THE INVENTION

Electronic devices come in many shapes and sizes. One type of electronic device can be formed by mounting electronic device components on a substrate. Some substrates can be quite small, i.e. credit card-size or less, such that the resultant device formed thereon is itself quite small. There is generally, within the industry, an emphasis on decreasing overall device dimensions while increasing the overall performance and/or capabilities of a device. Such industry focus presents challenges regarding, among other things, providing a device package which is sufficient for its intended purpose and durable enough to withstand the abuses expected in the operating environment.

An electronic device 20 is shown in FIGS. 1 and 2. Device 20 includes a flexible circuit substrate 22 upon which various electronic components have been mounted. In the illustrated example, device 20 is configured as a battery-powered communication device which is suitable for use as an RF communication device. Accordingly, device 20 includes an antenna 24 supported over substrate 22, a thin-profile battery 26 (FIG. 1) mounted on the substrate, and an integrated circuitry chip 28 configured for RF operation. An exemplary device and/or chip is shown and described in U.S. patent application Ser. No. 08/705,043, which names James O'Toole, John R. Tuttle, Mark E. Tuttle, Tyler Lowrey, Kevin Devereaux, George Pax, Brian Higgins, Shu-Sun Yu, David Ovard and Robert Rotzoll as inventors, which was filed on Aug. 29, 1996, is assigned to the assignee of this patent application, and incorporated by reference herein.

One challenge in producing a device such as device 20 relates to mounting the electronic components on the substrate; in particular, mounting battery 26 suitably on substrate 22 such that not only are desirable electrical connections made between electronic componentry and the battery, but the battery is sufficiently physically fixed over the substrate so that it does not become inadvertently dislodged.

Referring to FIGS. 2 and 3, device 20 is shown prior to battery 26 being mounted thereon. Substrate 22 is shown in an intermediate state of assembly and includes a temporary carrier substrate 36 and a thin polyester substrate 38 bonded therewith. Dashed line 30 in FIG. 2 depicts an outer perimeter of battery 26 where it is to be mounted on the substrate. Shown generally at 32 and within perimeter 30 is a conductive contact node pattern which, heretofore, has been utilized to form an electrical and mechanical connection with a thin-profile battery such as battery 26. Typically, such electrical and mechanical connection is formed through the application of a suitable conductive epoxy over the pattern, with the battery being subsequently bonded into place. Specifically, and shown in FIG. 3, conductive epoxy 34 is formed over each of the depicted nodes (not specifically designated). Battery 26 (FIG. 4) is placed on the epoxy such that a suitable bond is formed between the battery and the nodes.

It is desirable in some instances to encapsulate electronic devices within a mass of encapsulating material. Referring to FIG. 5, an encapsulating material 40 is formed over the substrate including the electronic components and battery 26. One process which is useful for providing encapsulant material around the electronic components, including underneath battery 26, is to repetitively vacuum process the substrate such that the encapsulant material eventually flows to a position underneath battery 26. Specifically, once encapsulant material 40 is provided over battery 26 as shown, any air underneath the battery is typically entirely surrounded by the encapsulant material and hence trapped. By conducting a vacuum draw down (typically in a vacuum chamber), the air which is trapped underneath the battery will be drawn out through the encapsulant material. When the vacuum is released, ambient air will, in trying to return underneath the battery, exert pressure on the encapsulant material and thereby move it in a direction underneath the battery. Such should theoretically occur sufficiently to entirely fill the area underneath the battery. Yet, as shown in FIG. 6, this is not always the case.

Referring to FIG. 6, during vacuum processing, portions of the substrate can upwardly engage the battery and effectively block off the region beneath the battery. Such blocked-off area typically remains isolated during processing so that the encapsulant material does not sufficiently fill the area. In the illustrated example, substrate portions 42, 44 of polyester substrate portion 38 have been, through vacuum processing, deformed to engage the facing battery terminal housing member of battery 26. Such prevents encapsulating material 40 from achieving contact with battery 26 in areas designated with the letter "A". This condition is undesirable for a number of reasons including the inadequacy of encapsulating material coverage and the related impact it has on the ability of individual electronic components to be fully and rigidly supported over the substrate.

This invention arose out of concerns associated with providing improved apparatuses and methods for mounting electronic components over substrates. This invention also arose out of concerns associated with providing improved electronic devices.

SUMMARY OF THE INVENTION

Battery mounting apparatuses, electronic devices, and methods of forming electrical connections are described. In one implementation, a flexible circuit substrate has an area within which an electrical component, e.g. a thin-profile battery terminal housing member, is to be adhered. A conductive contact node pattern is disposed within the area and sized to be conductively adhered with the component. In one aspect, the conductive contact node pattern comprises an outer conductive node on the substrate at least a portion of which is positioned within the outermost 25% of the area. An electrical component is conductively bonded with the contact node pattern and encapsulating material is provided over and underneath the component. In a preferred aspect, the substrate and electrical component are vacuum processed sufficiently to redistribute the encapsulating material under the component. The positioning of the contact node pattern provides sufficient support during vacuum processing such that any tendency of the substrate to become lodged against the component is reduced, if not eliminated.

BRIEF DESCRIPTION OF THE DRAWINGS

Preferred embodiments of the invention are described below with reference to the following accompanying drawings.

FIG. 1 is a view of an electronic device constructed in accordance with known methods.

FIG. 2 is a view of the FIG. 1 device with an electronic component removed for clarity.

FIG. 3 is a view which is taken along line 3—3 in FIG. 2.

FIG. 4 is a view similar to that of FIG. 3, except that it depicts the electronic device at a different processing step.

FIG. 5 is a view similar to that of FIG. 3, except that it depicts the electronic device at a different processing step.

FIG. 6 is a view similar to that of FIG. 3, except that it depicts the electronic device at a different processing step.

FIG. 7 is a view similar to that of FIG. 3, except that it depicts the electronic device at a different processing step.

FIG. 8 is an enlarged view of a component-mounting apparatus constructed in accordance with one implementation of the present invention.

FIG. 9 is a reduced-in-size view of the FIG. 8 apparatus at a subsequent processing step.

FIG. 10 is a view which is taken along line 10—10 in FIG. 8.

FIG. 11 is a view which is taken along line 11—11 in FIG. 8.

FIGS. 12 and 13 are views which are similar to those of FIGS. 10 and 11 respectively, except that such views depict the apparatus at a different processing step.

FIGS. 14 and 15 are views which are similar to those of FIGS. 12 and 13 respectively, except that such views depict the apparatus at a different processing step.

FIGS. 16 and 17 are views which are similar to those of FIGS. 14 and 15 respectively, except that such views depict the apparatus at a different processing step.

DETAILED DESCRIPTION OF THE PREFERRED EMBODIMENTS

Figure 18:
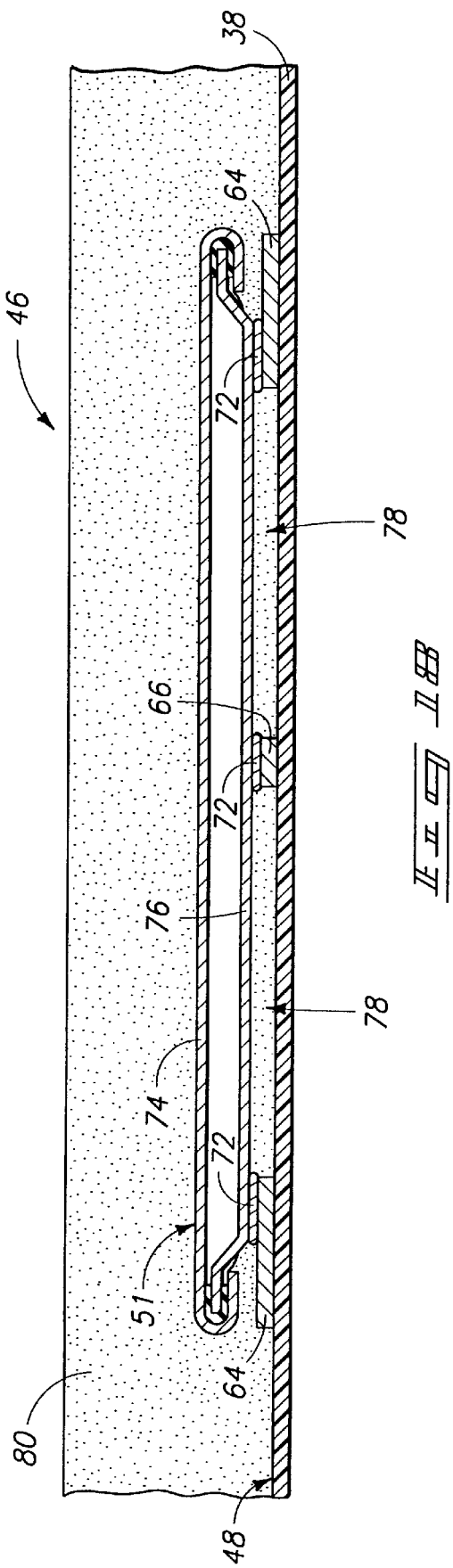
FIG. 18 is a view which is similar to FIG. 14, except that a temporary carrier substrate has been removed.

This disclosure of the invention is submitted in furtherance of the constitutional purposes of the U.S. Patent Laws "to promote the progress of science and useful arts" (Article 1, Section 8).

Referring to FIGS. 8–11, an apparatus 46 for use in mounting electrical components is illustrated in various states of assembly with an exemplary component. In the illustrated example, apparatus 46 comprises a battery mounting apparatus and the electrical component comprises a thin-profile battery.

Apparatus 46 comprises a substrate 48 having an area 50 which defines a perimeter within or over which a thin-profile battery terminal housing member of a thin-profile battery 51 (FIG. 9) is to be conductively adhered and entirely cover. A contact node pattern 52 is provided within area 50 and is sized to be adhered with a terminal housing member of the thin-profile battery. In a preferred implementation, contact node pattern 52 as well as antenna 24 are formed from conductive material which is screen or stencil printed onto substrate 48. An exemplary material is conductive silver printed thick film ink. The illustrated contact node pattern is formed over a central location 54 within area 50 and branches outwardly therefrom.

In the illustrated example, pattern 52 (FIG. 8) includes a central node 56 which is disposed over central location 54. A plurality of inner nodes 58 are spaced radially outwardly from central node 56 and directly conductively connected therewith by individual respective spokes or arms 60 which extend between inner nodes 58 and central node 56. The inner nodes constitute a first array of nodes which are spaced respective first distances from central location 54. The first array is positioned within area 50 along a continuous first line 62 which, in the illustrated example, defines a generally circular shape having a first radius. The respective first distances are generally the same because the inner nodes are spaced radially from central node 56 along a first generally equivalent radius. Of course, other radii and line shapes along which such inner nodes are formed are possible.

A plurality of outer nodes 64 are provided and are conductively connected with central node 56 either directly, via spokes 66 which extend therebetween, or via spokes 68 which extend between certain of the outer nodes and inner nodes 58. At least two of the nodes are positioned at different radial distances along a straight line extending radially outwardly from central location 54. The outer nodes are positioned outwardly of the inner nodes and define a second array of nodes. Nodes of the second array are spaced respective second distances from central location 54, with the second distances being greater than the first distances. The illustrated area 50 approximates a circle and the first and second distances define different radii of concentric circles. In the illustrated example, the first array comprises at least three individual nodes and the second array comprises at least six individual nodes. All of the nodes, both inner and outer, are in electrical communication with one another. Such is made possible by directly conductively connecting each node with one other node. It is possible, however, for some of the nodes to be in electrical isolation from one another as by grouping the nodes into separate groups. The nodes of the second array are positioned more or less, within area 50 along a continuous second line 70 which, in the illustrated example, defines a generally circular shape having a second radius which is greater than the first radius. As with the first line, other second line shapes are possible.

In the illustrated connection of nodes, at least one inner node 58 is directly connected with one outer node 64. Specifically, each illustrated inner node is directly connected with an associated outer node. At least one outer node 64 is not, however, directly connected with an inner node. Specifically, four of the illustrated outer nodes are not directly connected with inner nodes. Rather, such outer nodes are directly connected with central node 56. The above constitutes but one exemplary node connection. The nodes can be provided in any suitable shape or configuration. In the illustrated example such nodes are generally circular in shape. Moreover, the sizes of each node can vary relative to one another. Contact node pattern 52 can be supported entirely within area 50 or the pattern can extend outwardly of area 50, as some of the outer nodes do in FIG. 8.

In accordance with a preferred implementation, at least one of the nodes comprising contact node pattern 52 is disposed or positioned over an area portion proximate the perimeter of area 50 which comprises an outermost 25% of the area within which the housing member is to be adhered. In the illustrated example, each outer node 64 is positioned over the area portion which constitutes the outermost 25% of area 50, and none of the inner nodes are disposed over the area portion. The illustrated outer nodes are generally equidistant from central location 54. Accordingly, the second array has a predominant number of its nodes positioned within the outermost 25% area portion. Even more preferably, at least some of one of the nodes comprising the contact node pattern is disposed over an outermost 10% of area 50. Advantages of the above-described contact node pattern will become apparent below as the mounting of an electronic component, i.e. thin-profile battery 51, is discussed.

Referring to FIGS. 12 and 13, thin-profile battery 51 is provided and includes a pair of generally planar surfaces 74, 76. Each surface defines a portion of a terminal housing member. Conductive epoxy 72 is provided over the individual nodes of contact node pattern 52 and battery 51 is placed thereon. The epoxy is subsequently cured to bond surface 76 with the associated nodes. As cured, the epoxy provides at least three discrete adhesive masses which are formed at different radial distances relative to the center of the battery. In one aspect, the three masses are formed along a straight line extending radially outward from the center of the battery. The bonding of battery 51 with the conductive nodes defines a space 78 between unbonded housing member surface portions of surface 76 and the substrate. Additionally, a plurality of openings are defined into space 78. Specifically, and referring to FIGS. 8 and 12, openings or passageways into space 78 are defined between each of the outer nodes. That is, with battery 51 having been bonded in place over the outer nodes, the conductive nodes and epoxy cooperate to provide openings or passageways into space 78 (FIG. 12).

Referring to FIGS. 14 and 15, a generally flowable encapsulating material 80 is formed over the substrate and thin-profile battery.

Referring to FIGS. 16 and 17, substrate 48 is exposed to vacuum processing conditions which are effective to flow the flowable material under battery 51. In a preferred implementation, substrate 48 is placed in a vacuum processing chamber and vacuum processed therewithin sufficiently to redistribute at least some of the flowable material intermediate surface 76 and the substrate. Such can be accomplished is by creating negative pressure around the substrate sufficient to remove a portion of any ambient air within the space underneath the battery. Subsequently, a positive pressure can be created around the substrate which is sufficient to advance some of the flowable material through the openings defined between outer nodes 64 and into spaces 78. Repetitively processing the substrate by changing the pressure conditions can further enhance the coverage of encapsulating material 80 underneath the battery. Specifically, by successively creating and releasing a vacuum at different times within the chamber, encapsulating material 80 can be made to creep into and substantially, if not completely fill spaces 78.

Subsequently, such material can be cured and/or solidified into a generally non-flowable material over the substrate and substantially underneath the battery and any other electric component for that matter. During the vacuum processing, the conductive nodes and epoxy significantly reduce, if not eliminate all together, the tendency of the substrate or portions thereof to become upwardly engaged against the facing surface of the component being mounted.

The above-described processing permits electronic devices to be formed which have better structural integrity. In one implementation an electronic device includes a generally flexible substrate configured for supporting electronic componentry thereon. An electrical component, such as a battery, has an outer mounting surface which is mounted, via conductive epoxy, to a series of spaced electrical contacts or contact nodes which are arranged on the substrate. The epoxy has a thickness dimension normal to the outer mounting surface such that the epoxy and the electrical contacts collectively position the outer surface of the electrical component over the substrate in a manner which defines a space or gap therebetween. Such defines unbonded surface portions which face the substrate. Encapsulant material which is ultimately generally rigidified is disposed over the electrical component and intermediate the outer surface thereof and the substrate. The encapsulant material effectively seals the electrical component on the substrate and provides sufficient structural support thereto.

Referring to FIG. 18, carrier substrate 36 is removed from polyester substrate 38, with the resultant electronic device having a generally rigidified construction.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A battery mounting apparatus comprising:
   a substrate having an area over which a thin-profile battery terminal housing member is to entirely cover; and
   at least three outer conductive nodes on the substrate at least portions of which are positioned within the outermost 25% of the area, the three outer conductive nodes being electrically connected by conductive traces formed on the substrate which are received within the area.

2. A battery mounting apparatus comprising:
   a substrate having a circular area over which a thin-profile battery terminal housing member is to entirely cover;
   an outer conductive node on the substrate at least a portion of which is positioned within the outermost 25% of the area; and
   a plurality of inner conductive nodes, the inner and outer nodes being positioned at different radial distances from a center of the area.

3. The battery mounting apparatus of claim 2, wherein at least one inner node and at least one outer node are positioned at different radial distances along a straight line extending radially outward from the center of the area.

4. The battery mounting apparatus of claim 1 comprising at least four outer conductive nodes on the substrate at least portions of which are positioned within the outermost 25% of the area, the four outer conductive nodes being electrically connected by conductive traces formed on the substrate which are received within the area.

5. The battery mounting apparatus of claim 1 comprising at least five outer conductive nodes on the substrate at least portions of which are positioned within the outermost 25% of the area, the five outer conductive nodes being electrically connected by conductive traces formed on the substrate which are received within the area.

6. The battery mounting apparatus of claim 1 comprising at least six outer conductive nodes on the substrate at least portions of which are positioned within the outermost 25% of the area, the six outer conductive nodes being electrically connected by conductive traces formed on the substrate which are received within the area.

7. A battery powerable apparatus comprising:
   a flexible circuit substrate;
   a battery bonded to and spaced from the flexible circuit substrate with at least three discrete adhesive masses, the at least three masses being formed at different radial distances relative to a center of the battery; and
   an encapsulant over the substrate and battery, and substantially filling space intermediate the battery and flexible circuit substrate.

8. A battery powerable apparatus comprising:
a flexible circuit substrate;
a battery bonded to and spaced from the flexible circuit substrate with at least three discrete adhesive masses, the at least three masses being formed along a straight line extending radially outward from a center of the battery; and
an encapsulant over the substrate and battery, and substantially filling space intermediate the battery and flexible circuit substrate.

9. A radio frequency communication apparatus comprising:
a flexible circuit substrate having a surface with at least one antenna printed thereon;
a battery bonded to and spaced from the flexible circuit substrate surface with at least three discrete adhesive masses, the at least three masses being formed at different radial distances from a center of the battery; and
an encapsulant over the substrate and battery, and substantially filling space intermediate the battery and flexible circuit substrate.

10. A radio frequency communication apparatus comprising:
a flexible circuit substrate having a surface with at least one antenna printed thereon;
a battery bonded to and spaced from the flexible circuit substrate surface with at least three discrete adhesive masses, the at least three masses being formed along a straight line extending radially outward from a center of the battery;
an encapsulant over the substrate and battery, and substantially filling space intermediate the battery and flexible circuit substrate.

11. A battery mounting apparatus comprising:
a substrate having an area within which a thin-profile battery terminal housing member is to be adhered;
a conductive contact node pattern within the area sized to be conductively adhered with the terminal housing member, the contact node pattern comprising:
a central node;
at least two inner nodes spaced outwardly from the central node and a pair of spokes conductively connected with and extending between respective inner nodes and the central node; and
at least two outer nodes conductively connected with the central node and positioned outwardly of the two inner nodes.

12. The battery mounting apparatus of claim 11, wherein one of the inner nodes is directly connected with one of the outer nodes.

13. The battery mounting apparatus of claim 11, wherein each inner node is directly connected with an outer node.

14. The battery mounting apparatus of claim 13, wherein at least one of the outer nodes is not directly connected with an inner node.

15. The battery mounting apparatus of claim 11, wherein the nodes are generally circular in shape.

16. The battery mounting apparatus of claim 15, wherein one of the nodes is different in size from another of the nodes.

17. A battery mounting apparatus comprising:
a substrate having an area over which a thin-profile battery is to be mounted; and
a conductive contact node pattern disposed within the area and sized to be conductively adhered with a terminal housing member of the thin-profile battery, the contact node pattern comprising:
a first array of nodes spaced respective first distances from a central location within the area;
a second array of nodes spaced respective second distances from the central location, the second distances being greater than the first distances; and
a plurality of conductive arms, individual arms conductively connected with and extending between respective nodes of the first and second arrays.

18. The battery mounting apparatus of claim 17, wherein the contact node pattern is supported entirely within the area.

19. The battery mounting apparatus of claim 17, wherein the area approximates a circle and the first and second distances define different concentric radii within the circle.

20. The battery mounting apparatus of claim 17, wherein the first array comprises at least three individual nodes.

21. The battery mounting apparatus of claim 17, wherein the second array comprises at least six individual nodes.

22. The battery mounting apparatus of claim 17 further comprising a central node disposed over the central location and in electrical communication with nodes of the first and second arrays.

23. A battery mounting apparatus comprising:
a substrate having an area within which a thin-profile battery terminal housing member is to be adhered, the area being defined inside a perimeter outside of which the housing member is not to be adhered; and
a printed conductive node pattern provided within the area and sized to be conductively adhered with the housing member, the conductive node pattern comprising a plurality of nodes at least three of which are positioned over a portion of the area proximate the perimeter, the portion comprising an outermost 25% of the area within which the housing member is to be adhered, the three nodes being electrically connected by conductive traces formed on the substrate which are received within the area.

24. The battery mounting apparatus of claim 23, wherein the perimeter is generally circular in shape.

25. A battery mounting apparatus comprising:
a substrate having an area within which a thin-profile battery terminal housing member is to be adhered, the area being defined inside a perimeter outside of which the housing member is not to be adhered; and
a printed conductive node pattern provided within the area and sized to be conductively adhered with the housing member, the conductive node pattern comprising a plurality of nodes at least one of which being positioned over a portion of the area proximate the perimeter, the portion comprising an outermost 25% of the area within which the housing member is to be adhered, wherein the plurality of nodes comprises at least six nodes positioned over the outermost 25% of the area.

26. A battery mounting apparatus comprising:
a substrate having an area within which a thin-profile battery terminal housing member is to be adhered, the area being defined inside a perimeter outside of which the housing member is not to be adhered; and
a printed conductive node pattern provided within the area and sized to be conductively adhered with the housing member, the conductive node pattern comprising a plurality of nodes at least one of which being positioned over a portion of the area proximate the perimeter, the portion comprising an outermost 25% of the area within which the housing member is to be adhered, wherein the plurality of nodes comprise:
a first array having more than two nodes spaced from a central location within the area;
a second array having more than two nodes spaced from the central location;
nodes of one of the arrays being generally equidistant from the central location; and
one of the arrays having a predominate number of its nodes positioned within the outermost 25% of the area.

27. A battery mounting apparatus comprising:
a substrate having a generally circular area within which a thin-profile battery terminal housing member is to be adhered; and
a printed conductive node pattern provided within the area and sized to be conductively bonded with the housing member, the conductive node pattern comprising:
a central node positioned proximate a central location within the circular area;
an inner node radially spaced from and in conductive communication with the central node; and
an outer node radially spaced outwardly from the inner node to position at least some of the outer node over an outermost 10% of the circular area.

28. The battery mounting apparatus of claim 27, wherein the outer node is directly conductively connected with the central node.

29. The battery mounting apparatus of claim 27, wherein the outer node is directly conductively connected with the inner node.

30. A battery mounting apparatus comprising:
a substrate having a generally circular area within which a thin-profile battery terminal housing member is to be adhered;
a printed conductive node pattern provided within the area and sized to be conductively bonded with the housing member, the conductive node pattern comprising:
a first array of inner nodes positioned within the area along a first line which defines a generally circular shape having a first radius; and
a second array of outer nodes positioned within the area along a second line which defines a generally circular shape having a second radius which is greater than the first radius.

31. The battery mounting apparatus of claim 30, wherein the second radius is sufficient to position the outer nodes within an outermost 25% of the circular area.

32. The battery mounting apparatus of claim 30, wherein the second radius is sufficient to position some of at least one outer node over an outermost 10% of the circular area.

33. The battery mounting apparatus of claim 30, wherein the second radius is sufficient to position some of each outer node over an outermost 10% of the circular area.

34. The battery mounting apparatus of claim 30, wherein the second array comprises at least five outer nodes and the second radius is sufficient to position the at least five outer nodes over an outermost 25% of the circular area.

35. An electronic device comprising:
an electrical component having an outer mounting surface;
a flexible substrate having an area over which the electrical component is to be mounted;
a printed conductive node pattern provided within the area and sized to be conductively bonded with the outer mounting surface of the electrical component, the conductive node pattern comprising a central node positioned proximate a central location within the area, an inner node radially spaced from the central node, and an outer node radially spaced outwardly from the inner node to position at least some of the outer node over an outermost 10% of the circular area;
epoxy disposed over the conductive node pattern and bonding portions of the outer mounting surface of the electrical component therewith, other portions of the outer mounting surface facing the substrate and being unbonded with the epoxy,
the epoxy having a thickness generally normal to the outer mounting surface sufficient to define a gap between the unbonded outer mounting surface portions and the flexible substrate; and
an encapsulant material disposed over the substrate and effectively encapsulating the electrical component thereon, a portion of the encapsulant being disposed within the gap region between the unbonded outer mounting surface portions and the substrate.

36. A battery mounting apparatus comprising:
a substrate having an area within which a thin-profile battery terminal housing member is to be adhered, the area being defined inside a perimeter outside of which the housing member is not to be adhered; and
a printed conductive node pattern provided within the area and sized to be conductively adhered with the housing member, the conductive node pattern comprising a plurality of at least three nodes having portions which are positioned over a portion of the area proximate the perimeter, the portion comprising an outermost 25% of the area within which the housing member is to be adhered.

37. The battery mounting apparatus of claim 36 wherein the plurality of nodes comprises at least four nodes having portions positioned over the outermost 25% of the area.

38. The battery mounting apparatus of claim 36 wherein the plurality of nodes comprises at least five nodes having portions positioned over the outermost 25% of the area.

39. A battery mounting apparatus comprising:
a substrate having an area over which a thin-profile battery terminal housing member is to entirely cover;
an outer conductive node on the substrate at least a portion of which is positioned within the outermost 25% of the area; and
a centrally oriented node electrically connected with the outer conductive node by at least one conductive trace formed on the substrate.

40. The battery mounting apparatus of claim 39 wherein the substrate comprises a flexible substrate.

41. The battery mounting apparatus of claim 39 further comprising a battery conductively bonded with the nodes and an encapsulant received over the battery.

* * * * *